United States Patent [19]

Cray et al.

[11] Patent Number: 5,014,419

[45] Date of Patent: May 14, 1991

[54] TWISTED WIRE JUMPER ELECTRICAL INTERCONNECTOR AND METHOD OF MAKING

[75] Inventors: Seymour R. Cray; Nicholas J. Krajewski, both of Chippewa Falls, Wis.

[73] Assignee: Cray Computer Corporation, Colorado Springs, Colo.

[21] Appl. No.: 347,507

[22] Filed: May 4, 1989

Related U.S. Application Data

[63] Continuation-in-part of Ser. No. 53,142, May 21, 1987.

[51] Int. Cl.$^5$ ............................................. H05K 3/31
[52] U.S. Cl. ...................................... 29/830; 29/838; 29/840; 29/845
[58] Field of Search ................ 29/830, 838, 840, 845; 174/68.5; 361/414

[56] References Cited

U.S. PATENT DOCUMENTS

| | | |
|---|---|---|
| 1,035,580 | 6/1965 | Crawford et al. . |
| 1,946,889 | 7/1934 | Wessel ............................. 29/830.2 |
| 2,694,799 | 11/1954 | Del Camp . |
| 2,969,521 | 1/1961 | Scoville . |
| 3,022,480 | 2/1962 | Tiffany . |
| 3,097,032 | 7/1983 | Hochheiser . |
| 3,212,049 | 11/1965 | Mittler et al. . |
| 3,217,283 | 12/1962 | Shlesinger . |
| 3,255,430 | 6/1966 | Phillips . |
| 3,258,736 | 6/1966 | Crawford . |
| 3,319,217 | 5/1966 | Phillips . |
| 3,333,225 | 7/1967 | McNutt . |
| 3,371,249 | 2/1968 | Prohofsky . |
| 3,373,481 | 3/1968 | Lins et al. . |
| 3,400,358 | 9/1968 | Byrnes et al. . |
| 3,403,438 | 10/1968 | Best et al. . |
| 3,459,998 | 8/1969 | Foczrile . |
| 3,568,001 | 3/1981 | Straus . |
| 3,623,649 | 11/1971 | Keisling . |
| 3,670,409 | 11/1979 | Reimer . |
| 3,672,047 | 6/1972 | Sakamoto et al. . |
| 3,813,773 | 6/1974 | Parks . |
| 3,832,603 | 8/1974 | August . |
| 3,867,759 | 2/1975 | Soefler ............................. 29/830 |
| 3,904,934 | 3/1973 | Martin . |
| 4,110,904 | 9/1978 | Johnson . |
| 4,142,228 | 3/1979 | Flammer et al. . |
| 4,208,080 | 6/1980 | Teagno . |
| 4,216,576 | 8/1980 | Ammon et al. . |
| 4,285,002 | 8/1981 | Campbell . |
| 4,295,184 | 11/1981 | Roberts . |
| 4,326,663 | 4/1982 | Oettel . |
| 4,352,533 | 10/1982 | Murase et al. . |
| 4,374,457 | 2/1983 | Wiech, Jr. . |
| 4,417,392 | 11/1983 | Ibrahim et al. . |
| 4,514,784 | 4/1985 | Williams et al. . |
| 4,542,438 | 9/1985 | Yamamoto . |
| 4,550,493 | 11/1985 | Darrow . |
| 4,653,186 | 3/1987 | Kamijo . |
| 4,700,996 | 10/1987 | August et al. . |
| 4,720,770 | 1/1988 | Jameson . |
| 4,734,058 | 3/1988 | Pavlacka . |
| 4,797,113 | 1/1989 | Lambert . |
| 4,813,128 | 3/1989 | Massopust . |
| 4,873,764 | 10/1989 | Grimm . |

OTHER PUBLICATIONS

Article: "Connector Interposer for Module to Board Connection", Martyak, Natoli & Ricci; *IBM Technical Disclosure Bulletin*, vol. 14, No. 8, Jan. 1987.

*Primary Examiner*—Timothy V. Eley
*Attorney, Agent, or Firm*—John R. Ley

[57] ABSTRACT

A method and apparatus for interconnecting electronic circuit boards through the use of twisted wire jumpers which are formed from multifilament wire and which have enlarged bird cages formed along the pins. The pins are drawn through a stack of circuit boards to position the cages in contact with interconnection apertures located in the printed circuit boards. The frictional engagement of the cages in the apertures provides both electrical inter connection of, and mechanical coupling between the printed circuit boards.

19 Claims, 15 Drawing Sheets

Plated Hole Pattern On Circuit Board

Bonding Pad Pattern On Chip

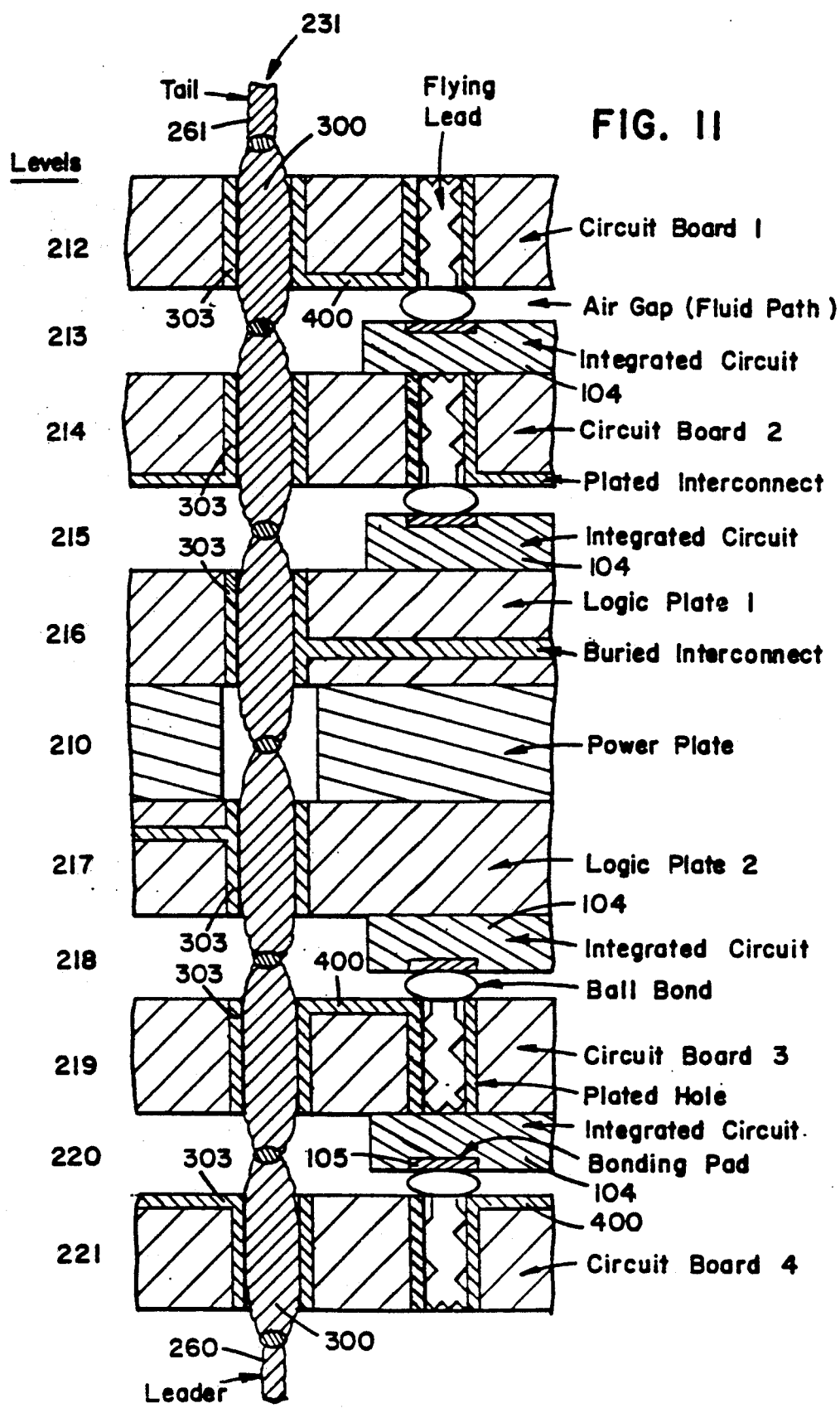

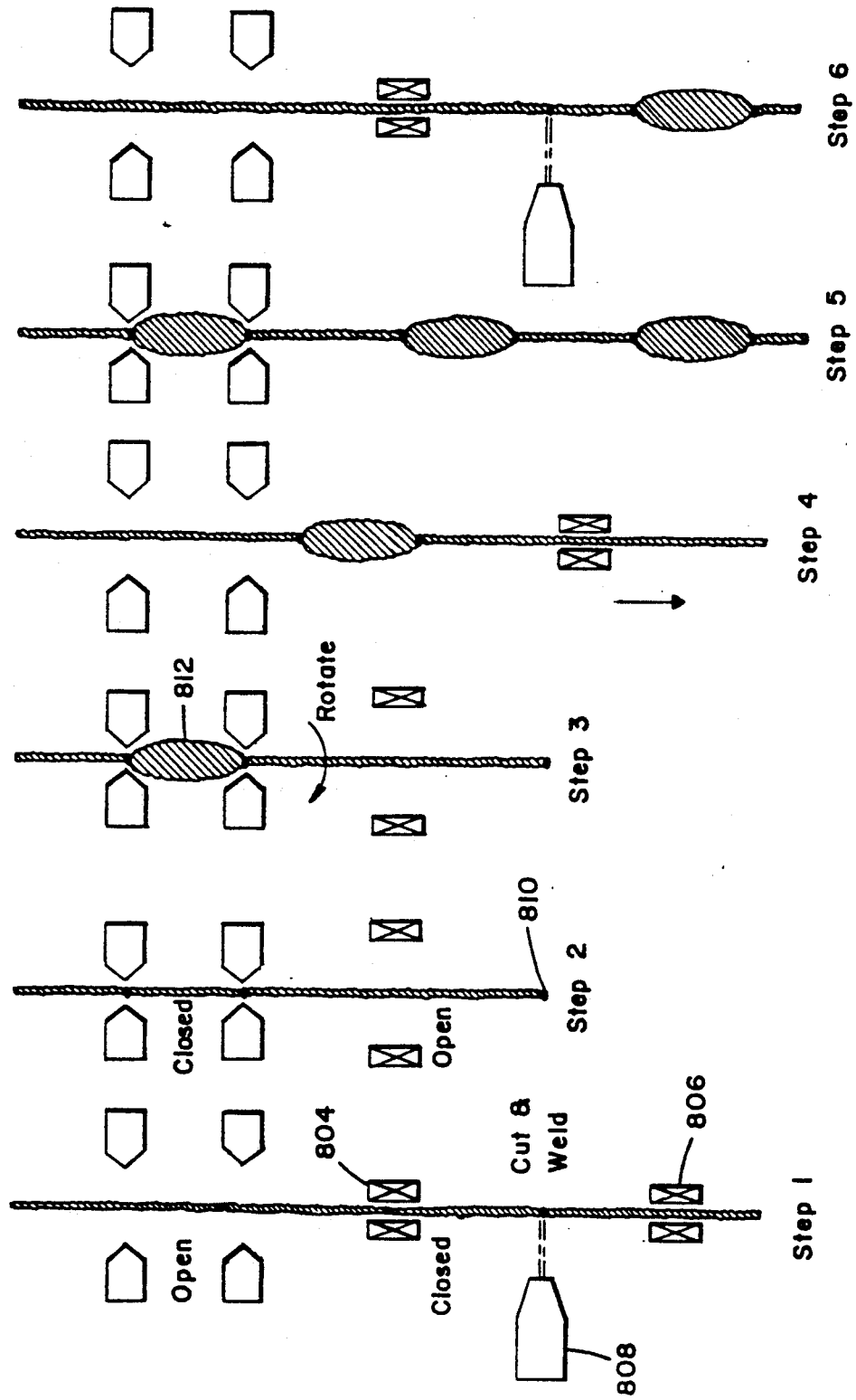

TWISTED WIRE JUMPER ELECTRICAL INTERCONNECTOR AND METHOD OF MAKING

RELATED APPLICATIONS

This application is a continuation-in-part of copending patent application Ser. No. 053,142, filed May 21, 1987. Both applications are assigned to the same assignee.

TECHNICAL FIELD OF THE INVENTION

The present invention relates to the field of electrical circuit connectors, and more specifically to both an apparatus and a method for interconnecting stacks of printed circuit boards.

BACKGROUND OF THE INVENTION

Integrated circuits are typically fabricated on wafers which are then cut up to form individual integrated circuits. These individual circuits are packaged within hermetically sealed ceramic or plastic packages. The signal and power lines from the integrated circuit are brought out to the pins of the package by means of leads attached to bonding pads on the integrated circuit chips. The chips are then used to form larger circuits by interconnecting the integrated circuit packages by means of printed circuit boards. These circuit boards may contain several layers of electrical interconnect. Typically the integrated circuit packages are soldered to the circuit board. The soldering process forms an electrical and mechanical connection between the integrated circuit package and the circuit board.

To form still larger circuits called modules, circuit boards may be arranged and interconnected in a variety of ways. One popular high density interconnect scheme is to stack the circuit boards in a sandwiched relationship and electrically interconnect the circuit boards with jumpers passed through the stack along the Z axis. This packing scheme achieves a relatively high packing density limited by heat dissipation and connector spacing requirements.

The aforementioned technique of forming larger circuits by using individually packaged integrated circuits mounted on circuit boards limits packing density. The actual integrated circuit chips themselves are typically smaller than one-tenth of a square inch, and only cover only 10-20 percent of the board area. Due to the low density achieved through the use of individually packaged integrated circuit chips and traditional interconnection technology, it is difficult to increase the operating speed of the system. Additionally, the inter-board spacing of stacked circuit boards is limited by the height of the integrated circuit packages and the inter-board connects. This limits packing density in the z direction as well. Configurations which limit packing density limit the interboard signal speed due to the long propagation delays associated with the long interconnect lines.

Another problem presented by traditional configurations relates to the ease with which modules can be disassembled. Forms of construction which involve soldering and staking of the board assemblies typically result in modules which cannot be disassembled or repaired.

The present invention provides a new apparatus and method for high-density interconnects of circuit boards which overcomes these disadvantages of the prior art.

SUMMARY OF THE INVENTION

The present invention provides for the interconnection of sandwiched circuit boards through the use of twisted wire jumper connectors installed in interconnection apertures of circuit boards.

The circuit boards disclosed for use with this invention have the integrated circuit chips attached directly to the printed circuit without the traditional ceramic or plastic packaging. The circuit boards themselves are manufactured with plated-through holes, having hole patterns substantially matching the bonding pad patterns of the integrated circuit chips.

The integrated circuit chips are manufactured with flying leads which are positioned facing the circuit board. The flying leads are inserted through the plated holes so that the flying leads protrude from the circuit board. Caul plates are then positioned on the outer sides of this sandwich and pressed together so that the sticky or soft gold of the flying leads is compressed within the plated holes, causing the soft gold to deform against the surface of the plated holes and thereby forming a strong electrical and mechanical bond. The caul plates are then removed and the integrated circuit package remains firmly attached to the circuit board. This results in improved packing density of integrated circuit chips on circuit boards.

Two or more stacked circuit boards are interconnected using electrically conductive twisted wire jumper connectors or jumpers inserted into the plated-through holes of the stacked circuit boards. The twisted wire jumper connectors are made from multifilament wire and have enlarged portions called bird cages, formed along their length. These bird cages bow out to a large outer radius, which is larger than the inner radius of the plated-through holes of the printed circuit boards. The twisted wire jumper connectors are used as inter board jumpers for the transmission of power or logic signals. The jumpers are preferably drawn through the stacked circuit boards through the use of a leader. The wiping action of the insertion creates a low impedance electrical connection between the circuit boards. The twisted wire jumper connector is made slightly longer than the stack height of the module so that a portion of the twisted wire jumper connector protrudes through one or both sides of the sandwich of circuit boards forming a stub. This stub may then be used to assist in the removal of the twisted wire jumpers to facilitate module repair.

BRIEF DESCRIPTION OF THE DRAWINGS

In the drawings like numerals identify like components throughout the several views.

FIG. 11 shows a cross-sectional view of a single twisted wire jumper logic jumper that has been installed through axially aligned plated-through holes of a stack of printed circuit boards of the module assembly of FIG. 9. The figure is shown in an exaggerated scale to clarify the operation of the invention.

FIG. 15 shows the method of manufacturing twisted wire jumper connectors.

FIG. 16b shows a cross section of the twisted wire jumper shown in FIG. 16a.

FIG. 16c shows a cross section of the twisted wire jumper shown in FIG. 16a.

DETAILED DESCRIPTION OF THE PREFERRED EMBODIMENT

The preferred embodiment of the present invention involves the high-density packing of silicon or gallium arsenide (GaAs) integrated circuit chips onto single-layer or multi-layer interconnect printed circuit boards. The circuit boards have plated-through holes or interconnection apertures which permit the high-density packing of circuit boards in a sandwiched arrangement. The application of this technology permits improved speed, improved heat dissipation, and improved packing density required for modern supercomputers such as the Cray-3 manufactured by the assignee of the present invention.

In the preferred embodiment of this application, the integrated circuit chips are attached to the circuit board by flying gold leads, as discussed below and disclosed in co-pending patent application Ser. No. 07/053,142 which is assigned to the same assignee of the present invention and which is incorporated by reference. By placing the integrated circuits directly on the circuit, the bulky packaging normally found on integrated circuits is eliminated.

Flying Lead Construction

Figure 1:
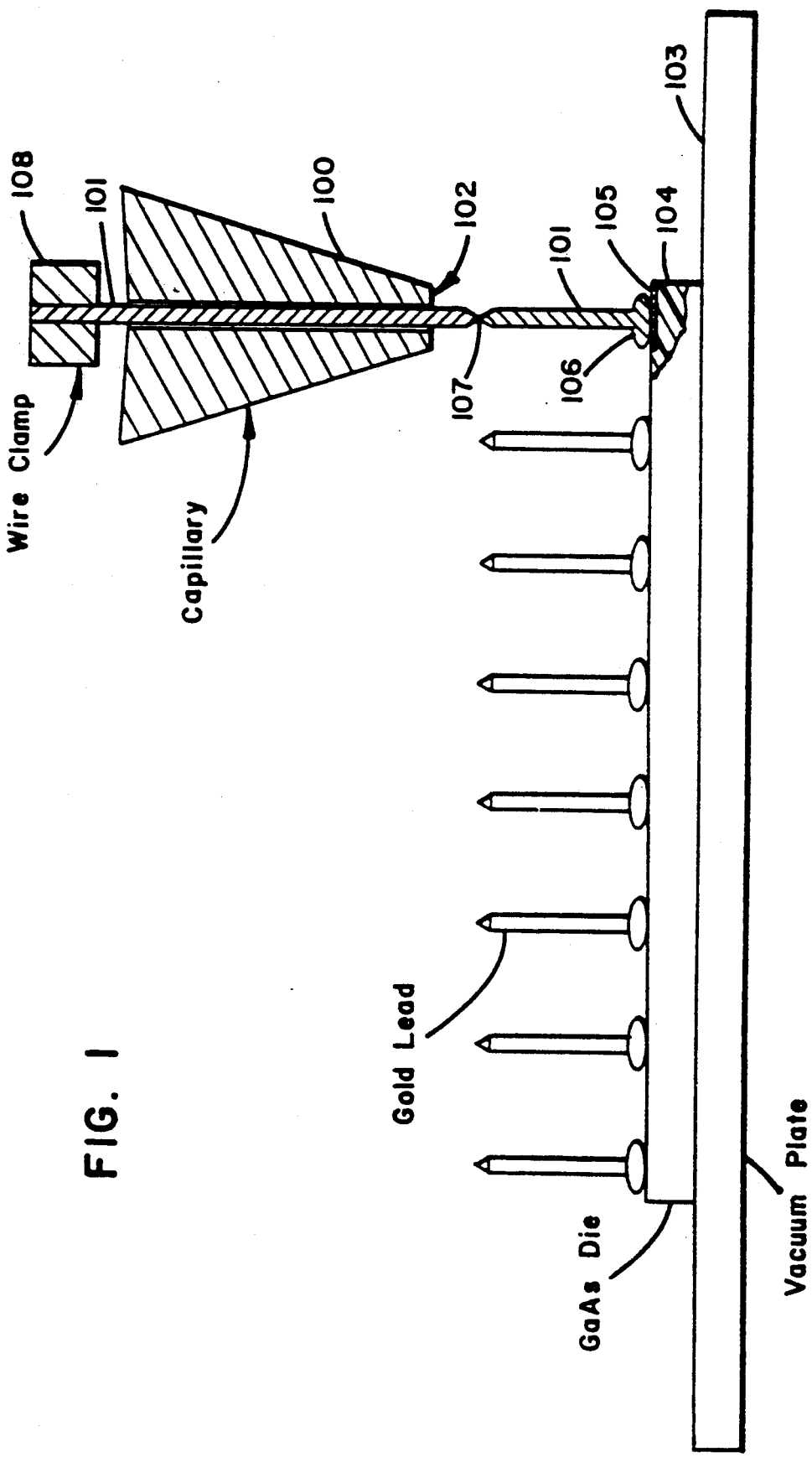
FIG. 1 is a side view of an integrated circuit die onto which flying gold leads are ball bonded and straightened by a ball bonding machine.

FIG. 1 shows the preferred embodiment for attaching the flying gold leads to the silicon or gallium arsenide packaged chip or die before attaching the die to the circuit board. The leads are made of soft gold wire which is approximately 3 mils in diameter. The GaAs chips used in the preferred embodiment contain 52 bonding pads which have a sputtered soft gold finish. The objective of the die bonding operation is to form a gold-to-gold bond between the wire and the pad. A Hughes automatic thermosonic (gold wire) ball bonding machine Model 2460-II may be modified to perform this operation. This machine is available from Hughes Tool Company, Los Angeles, Calif. This machine was designed and normally used to make pad-to-lead frame connections in IC packages and has been modified to perform the steps of flying lead bonding as described below. The modifications include hardware and software changes to allow feeding, flaming off, bonding and breaking heavy gauge gold bonding wire (up to 0.0030 dia. Au wire).

The Hughes automatic ball bonding machine has an X-Y positioning bed which is used to position the die for bonding. The die is loaded on the bed in a heated vacuum fixture which holds up to 16 dice. The Hughes bonding machine is equipped with a vision system which can recognize the die patterns without human intervention and position each bonding pad for processing.

The soft gold wire that is used for the flying leads in the preferred embodiment of the present invention is sometimes referred to as sticky gold or tacky gold. This gold bonding wire is formed from a 99.99% high-purity annealed gold. The process of annealing the high-purity gold results in a high elongation (20-25% stabilized and annealed), low tensile strength (3.0 mil., 50 gm. min.) gold wire which is dead soft. The wire composition (99.99% pure Au non-Beryllium doped) is as follows:

| Gold | 99.990% min. |
|---|---|
| Beryllium | 0.002% max. |
| Copper | 0.004% max. |
| Other Impurities (each) | 0.003% max. |
| Total All Impurities | 0.010% max. |

This type of gold is available from Hydrostatics (HTX grade) or equivalent.

Referring to FIG. 1, the flying lead die bonding procedure begins with the formation of a soft gold ball 106 at the tip of the gold wire 101. The wire is fed from a supply spool (not shown) through a nitrogen-filled tube 109 (shown in FIG. 2) to a ceramic capillary 100. The inside of the capillary is just slightly larger than the wire diameter. The direction of nitrogen flow in the connecting tube 109 can be altered to drive the wire either toward the die or toward the supply spool. This allows the gold wire to be fed into or with drawn from the capillary tip.

The gold ball 106 formed at the end of the gold wire 101 is thermosonically bonded to bonding pad 105 of chip 104. The capillary tip 102 of capillary 100 is capable of heating the ball bond to 300° C. concurrent with pressing the ball 106 onto the pad 105 and sonically vibrating the connection until a strong electrical and mechanical connection is formed. The capillary 100 is then withdrawn from the surface of the die 104 and the wire 101 is extruded from the tip 102. A notching mechanism, added to the Hughes ball bonder to perform the specific notching operation described herein, is used to make a notch 107 at the appropriate height, thus defining the length of the flying lead. The wire clamp 108 grasps the gold wire 101 and the capillary is withdrawn upward, breaking the flying lead at 107 and concurrently performing a nondestructive test of the ball bond to bonding pad connection and also straightening and stiffening the flying lead.

Figure 2:
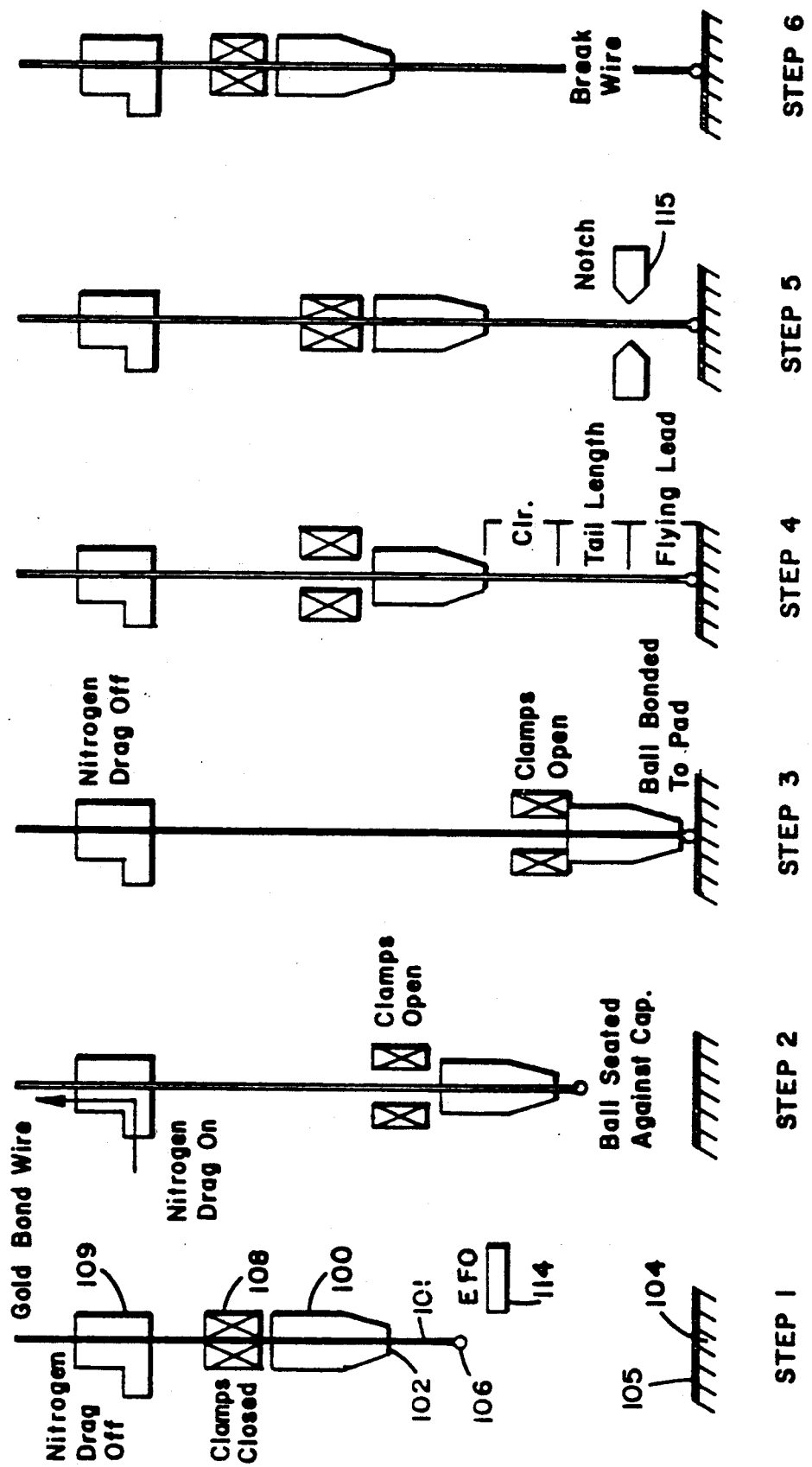
FIG. 2 shows the six steps that the flying lead ball bonder performs in order to attach a flying lead to an integrated circuit die.

The sequence of steps required to make a flying lead bond to the package die is shown in FIG. 2. Step 1 begins with the feeding of a predetermined amount of wire through the capillary 100. A mechanical arm then positions an electrode 114 below the capillary tip 102 and a high-voltage electrical current forms an arc which melts the wire and forms a gold ball with a diameter of approximately 6 mils. This operation is called electrostatic flame-off (EFO). Ball size is controlled through adjustment of the EFO power supply output. During this step, the clamps 108 are closed and the nitrogen drag is off. This action occurs above the surface of the integrated circuit chip so as to avoid any damage to the chip during the EFO ball forming process.

In step 2, the nitrogen drag 109 withdraws the supply wire 101 into the capillary 100 and tightens the ball against the capillary tip 102.

The capillary tip 102 is heated to approximately 200° C. to assist in keeping the gold wire 101 in a malleable state. The die fixture is also heated to 200° C. to avoid wire cooling during the bonding process. The die fixture is made of Teflon-coated aluminum. As shown in FIG. 1, a vacuum cavity or vacuum plate 103 holds the die 104 in position on the fixture during the bonding process.

In step 3, the bonding machine lowers the capillary 100 to the surface 105 of a bonding pad and applies high pressure (range of 30-250 grams) to the trapped gold ball 106 along with ultrasonic vibration at the capillary tip 102. The capillary tip 102 is flat, with a 4-mil inside diameter and an 8-mil outside diameter. The ball 106 is flattened to about a 3-mil height and a 6-mil diameter. Ultrasonic energy is supplied through the ceramic capillary 100 to vibrate the gold ball 106 and scrub the bonding pad surface. The sound is oriented so that the gold ball 106 moves parallel to the die surface. The Hughes ball bonding machine has the ability to vary the touchdown velocity, i.e., soft touch-down for bonding GaAs, which is program selected. The ultrasonic application is also program selected.

In step 4, the capillary 100 is withdrawn from the surface of the die 104, extending the gold wire 101 as the head is raised. The nitrogen drag is left off and the capillary is raised to a height to allow enough gold wire to form the flying lead, a tail length for the next flying lead, and a small amount of clearance between the tail length and the capillary tip 102. The Hughes ball bonder device is capable of selecting the height that the capillary tip can move up to a height of approximately 0.750 inch.

In step 5, an automatic notching mechanism 115 moves into the area of the extended gold wire 101 and strikes both sides of the wire with steel blades. This is essentially a scissor action which cuts most of the way through the gold wire 101, forming a notch 107 (FIG. 1). The notch 107 is made 27 mils above the surface of the die. The notching mechanism has been added to the Hughes ball bonder for the precise termination of the flying leads. The Hughes ball bonder has been modified to measure and display the notch mechanism height. The activation signal for the notch mechanism is provided by the Hughes ball bonder system for the proper activation during the sequence of ball bonding. The flying lead length is adjustable from between 0.0 mils to 50.0 mils. It will be appreciated by those skilled in the art that the notching function can be accomplished with a variety of mechanisms such as the scissor mechanism disclosed above, a hammer-anvil system, and a variety of other mechanisms that merely notch or completely sever the wire 101.

In step 6, clamp 108 closes on the gold wire 101 above the capillary 100 and the head is withdrawn until the gold wire breaks at the notched point. This stretching process serves several useful purposes. Primarily, the gold wire is straightened by the stretching force and stands perpendicular to the die surface. In addition, the bond is non-destructively pull-tested for adhesion at the bonding pad. The lead 101 is terminated at a 27-mil height above the die surface 104 in the preferred embodiment. At the end of step 6, the capillary head for the bonding mechanism is positioned over a new bonding pad and the process of steps 1-6 begins again. The bonding wire 101 is partially retracted into the capillary once again, and the clamps are closed, as shown in step 1, so that a new ball may be formed by the EFO.

The die positions are roughly determined by the loading positions in the vacuum fixture. The Hughes automatic bonding machine is able to adjust the X-Y table for proper bonding position of the individual die. An angular correction is automatically made to adjust for tolerance in placing the die in the vacuum fixture. This is done through a vision system which recognizes the die pad configurations. Using the modified Hughes automatic bonding machine with the current bonding technique, a minimum bonding rate of 2 die pads per second is possible.

Circuit Board Construction

Figure 3B:
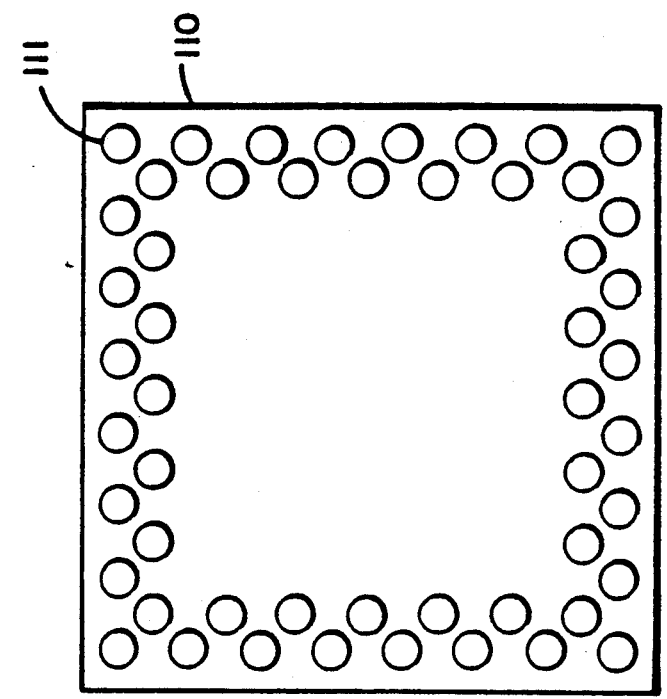
FIG. 3B shows the corresponding plated-through hole pattern on a circuit board which mates the integrated circuit chip onto circuit board.
Figure 3A:
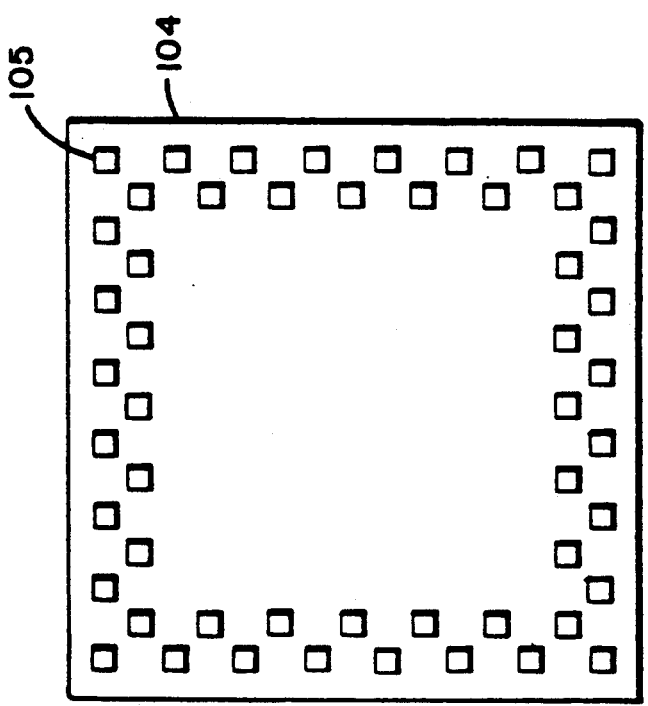
FIG. 3A shows the bonding pad pattern on a typical integrated circuit.

Once the gold bonding leads are attached to the integrated circuit chip or die, the die is ready to be attached to the circuit board. As shown in FIG. 3A, the bonding pattern of the integrated circuit die 104 matches the plated hole pattern on the circuit board 110, shown in FIG. 3B. For example, the top view of integrated circuit die 104 in FIG. 3A shows the bonding pad 105 in the upper right corner. The circuit board 110 shown in FIG. 3B shows a corresponding plated hole 111 which is aligned to receive the bonding lead from bonding pad 105 (shown in FIG. 3A) when circuit board 110 is placed over integrated circuit 104 and the flying leads are inserted into the hole pattern on the circuit board. Thus, each bonding pad of integrated circuit 104 has a corresponding plated hole on circuit board 110 aligned to receive the flying leads.

The circuit board assembly operation begins with the insertion of the die into the circuit board. The circuit board is held in a vacuum fixture during the insertion process to make sure that the board remains flat. Insertion can be done by hand under a binocular microscope or production assembly can be done with a pick-and-place machine.

Figure 4:
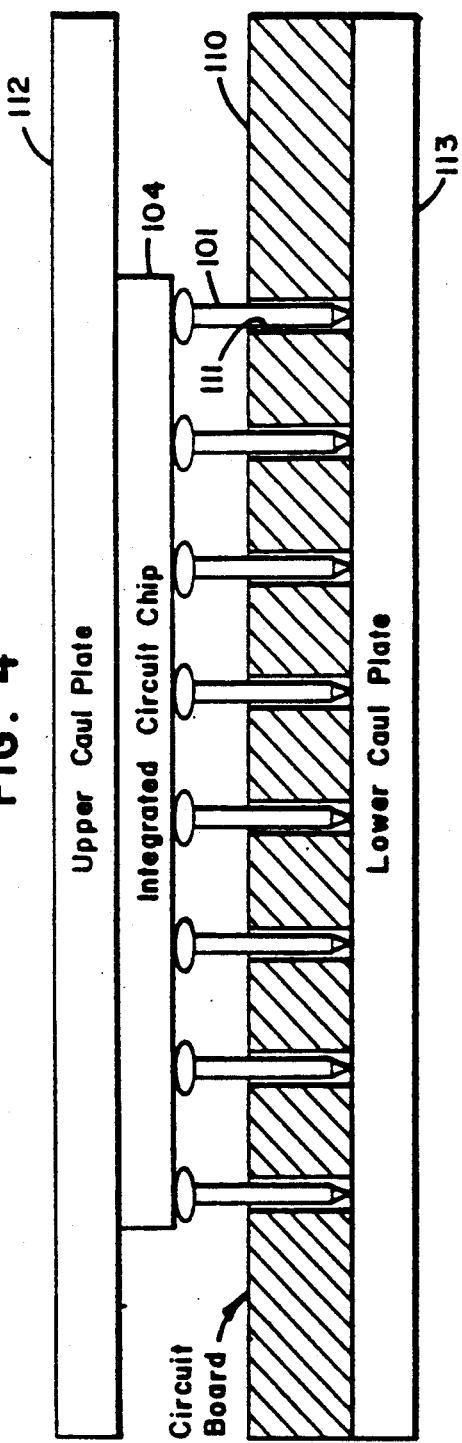
FIG. 4 shows the relative positions of the integrated circuit chip and the circuit board prior to compression of the flying leads into the plated holes.

Referring to FIG. 4, the circuit board 110 with the loosely placed die 104 is mounted on an aluminum vacuum caul plate (lower caul plate) 113. Steel guide pins (not shown) are placed in corner holes of the circuit board to prevent board motion during the assembly operation. A second (upper) caul plate 112 is then placed on the top side of the circuit board populated with chips to press against the tops (non-pad side) of the chips 104. The sandwich assembly comprising the circuit board, the chip and the caul plates is then placed in a press and pressure is applied to buckle and expand the gold leads 101 in the plated holes 111 of the circuit board.

Figure 5:
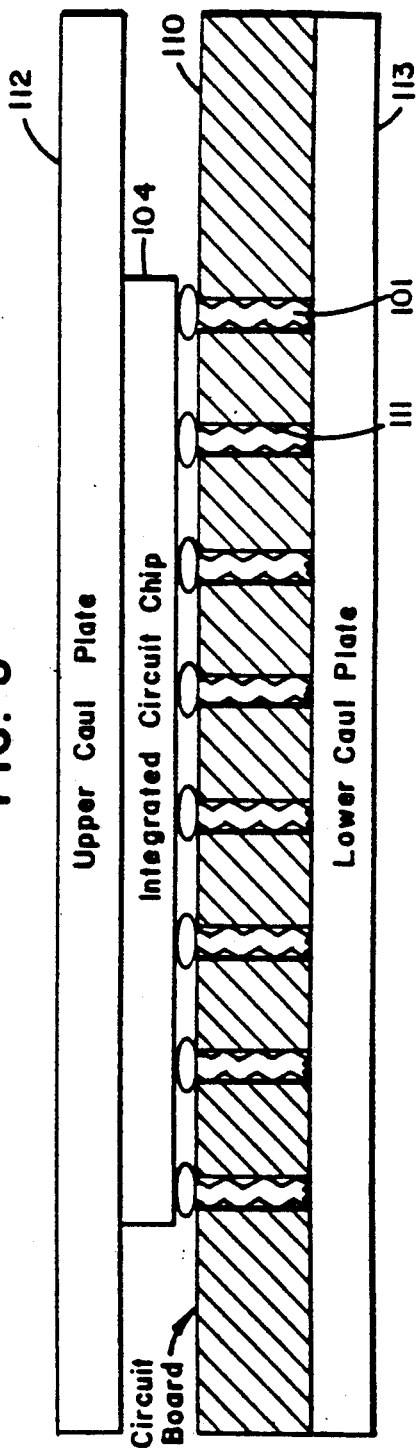
FIG. 5 shows the relative positions of the integrated circuit chip and the circuit board after the flying leads have been compressed inside the plated holes of the circuit board.
Figure 4A:
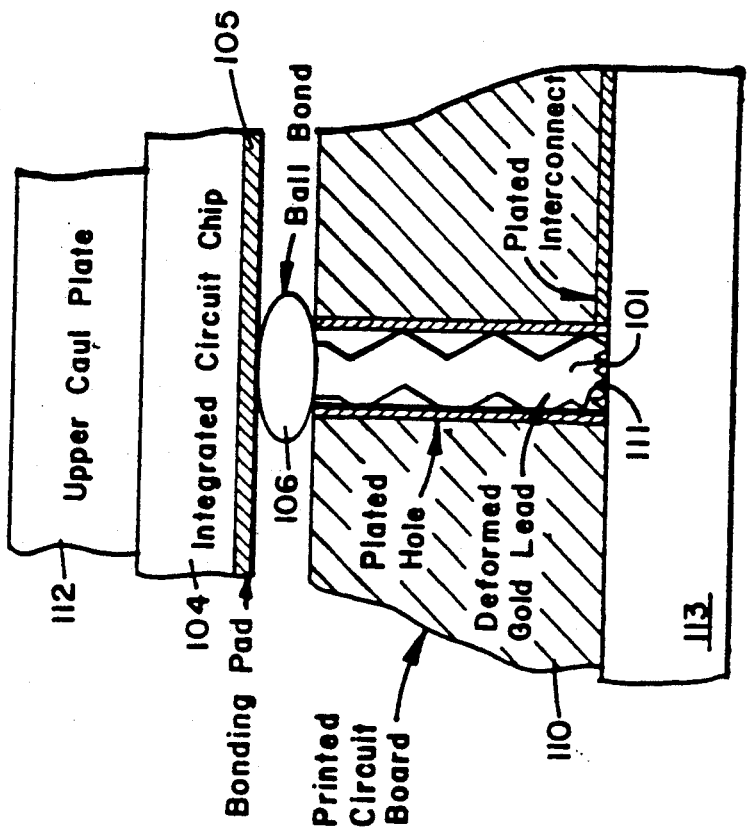
FIG. 4A is a closeup view of the relative positions of the integrated circuit chip and the circuit board prior to compression of the flying leads into the plated holes.
Figure 5A:
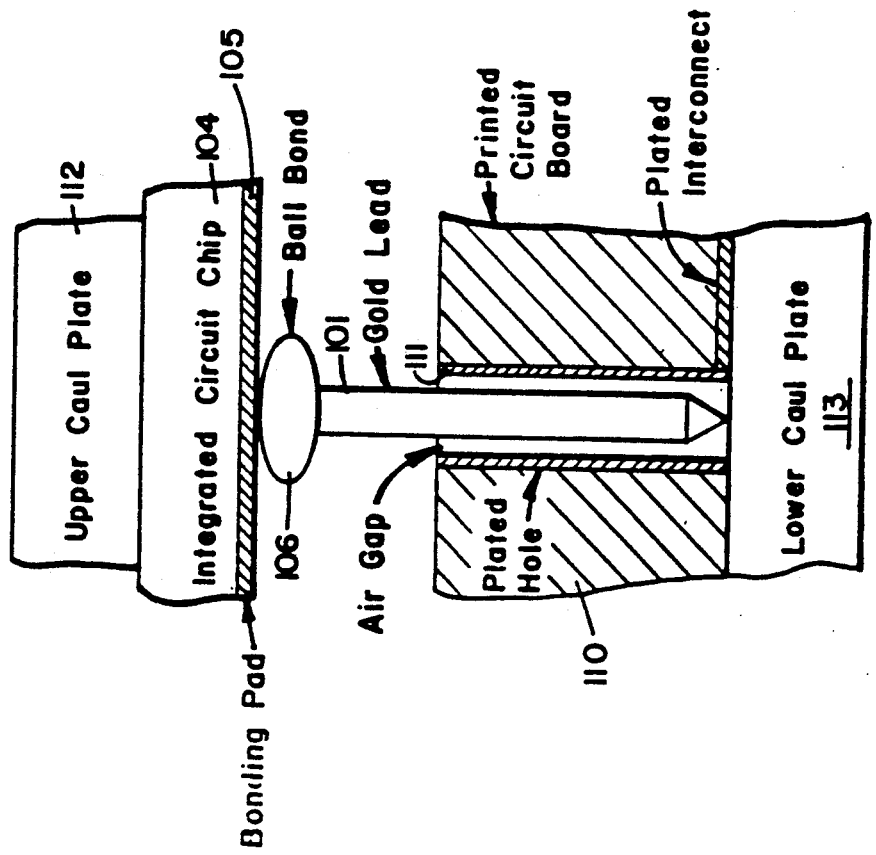
FIG. 5A is a closeup view of a ball-bonded flying lead that has been compressed into a plated-through hole on the circuit board.

The side view of the sandwiched circuit board 110, integrated circuit chip 104, and caul plates 112 and 113 in FIGS. 4 and 5 illustrates the position of the gold leads 101 before and after the pressing operation, respectively. In the preferred embodiment there is a 9-mil exposure of gold lead 101 of a total lead length of 29 mils which upon compression will buckle and expand into the plated hole 111 of the circuit board 110. The 3-mil diameter wire 101 in a 5-mil diameter hole 111 means the initial fill is 36 percent of the available volume. After pressing, the fill has increased to 57 percent as a result of the 9.2-mil shortening of the gold lead 101. As shown in greater detail in FIGS. 4a and 5a, the lead typically buckles in two or more places, and these corners are driven into the sides of the plated hole 111 of the circuit board. The integrated circuit pad 105 is electrically connected to the flying lead by the ball bonding process. The flying wire also electrically connects the integrated circuit to the circuit board through the pressing operation. The circuit board 110 may be removed from the press with the integrated circuit chip 104 securely attached and electrically bonded to the plated holes of the circuit board.

Figure 6:
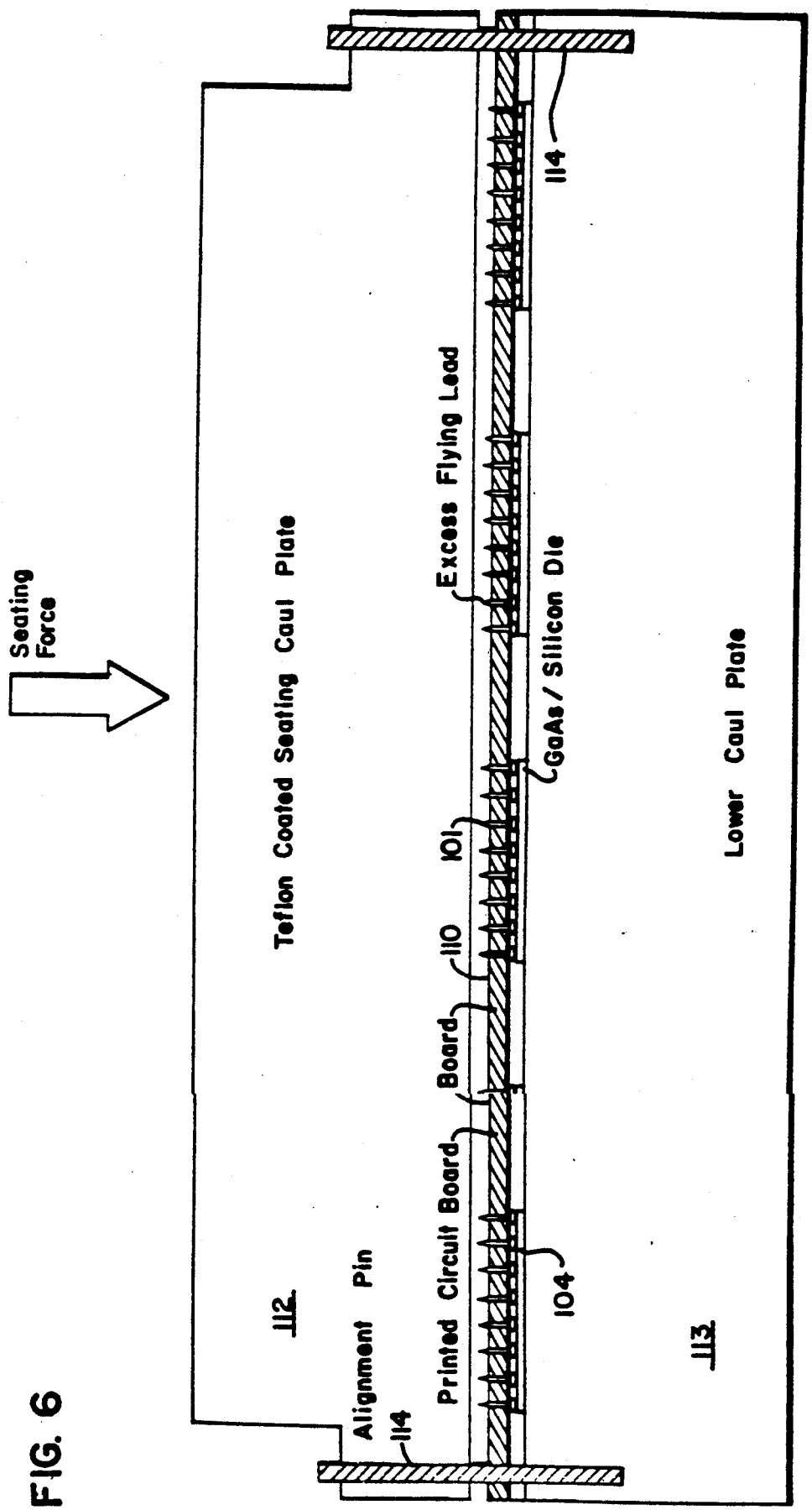
FIG. 6 is an side view illustrating the compression process wherein a plurality of integrated circuit chips having flying leads are attached to a single printed circuit board through the application of seating force on caul plates which sandwich the circuit board/chip combination.

FIG. 6 shows a view of the circuit board press which is used to attach the integrated circuits to the printed circuit board. The upper caul plate 112 is a Teflon-coated seating caul plate which is aligned through alignment pins 114 with the circuit board 110 and the lower caul plate 113 which is a vacuum caul plate to hold the circuit board flat during the pressing process. The alignment pins 114 are used to prevent the printed circuit board 110 from sliding or otherwise moving during the pressing process. A seating force is applied to the top of upper caul plate 112 which forces the excess flying lead material into the plated holes of printed circuit board 110. Thus, integrated circuits 104 are mechanically and electrically bonded to printed circuit board 110.

It will be appreciated by those skilled in the art that many variations of the above-described pressing operation can be used which results in the same or equivalent connection of the flying leads to the circuit boards. For example, the flying leads of the chips could be completely inserted into the through-plated holes of the circuit board prior to the pressing operation with the excess gold leads protruding out the opposite side. The first caul plate could then be used to hold the chip onto the circuit board while the second caul plate is used to compress the leads into the holes.

Module Assembly Construction

Figure 7:
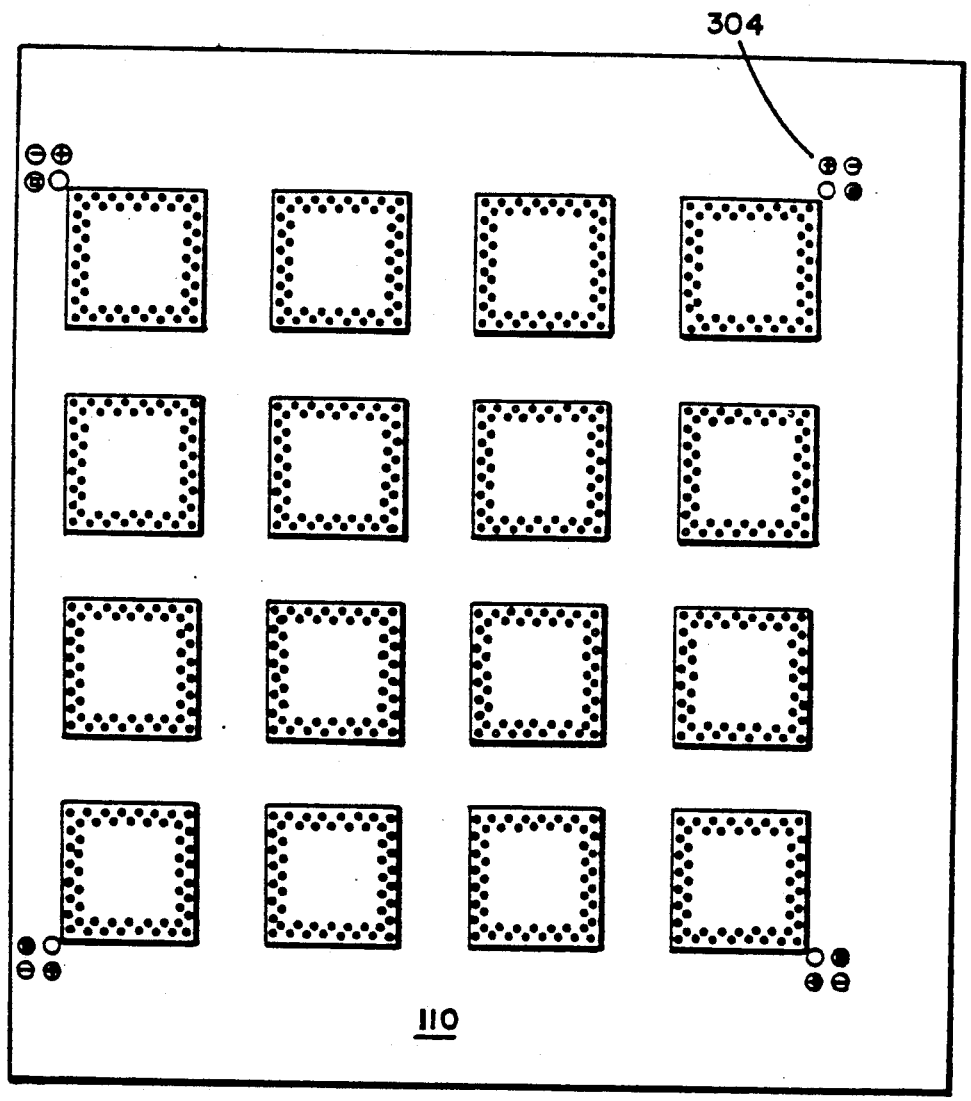
FIG. 7 shows a plated-through hole pattern for a typical board onto which integrated circuit dice are attached in the preferred embodiment of the present invention.

FIG. 7 shows an example of a printed circuit board hole pattern for the circuit boards used in the Cray-3 computer manufactured by the assignee of the present invention. In the preferred embodiment of the present invention, each circuit board provides 16 patterns of plated-through holes for receiving the flying leads of 16 integrated circuits. The 16 integrated circuits are attached to the circuit board shown in FIG. 7 through the pressing process previously described. Each aperture pattern on the circuit board 110 corresponds to the contact pad pattern shown on FIG. 3 from which the bonded flying lead extend outward as shown in FIG. 4. Each corner of circuit board 110 has a group of four plated-through holes 304 which are used for alignment during initial assembly. These apertures 304 are also used for power distribution in the completed module.

Figure 8:
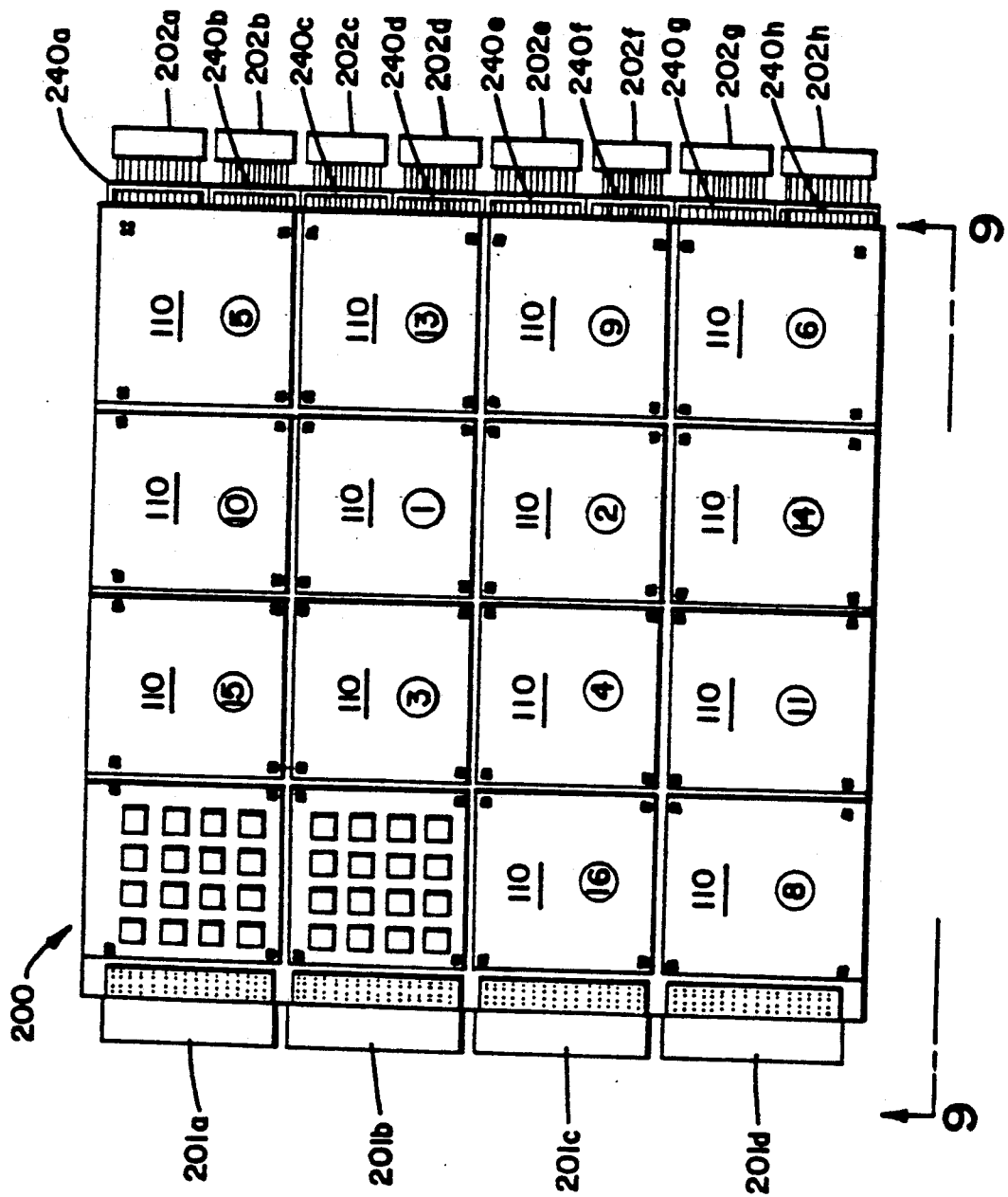
FIG. 8 shows a module assembly having a plurality of circuit boards nested together.
Figure 9:
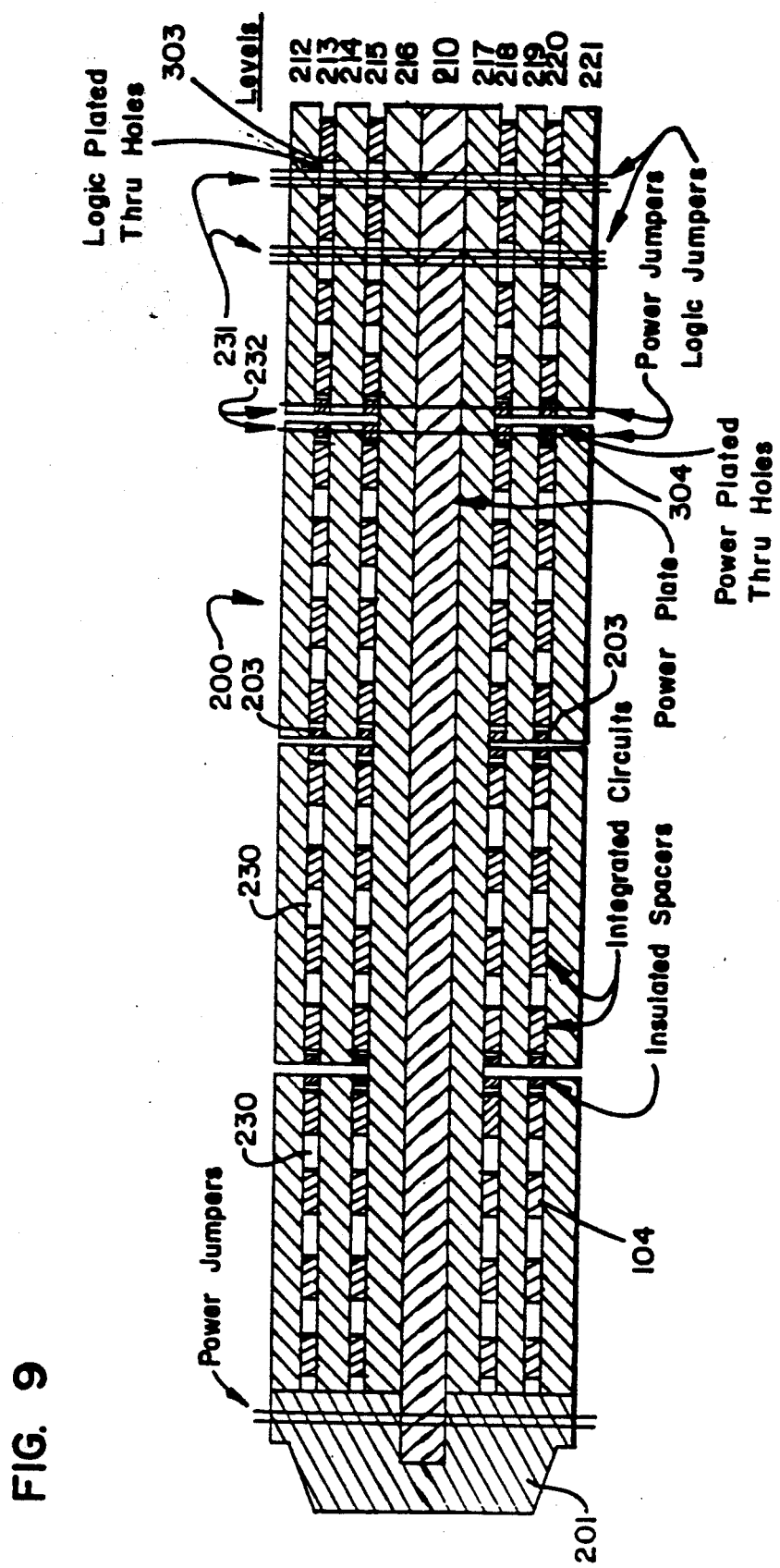
FIG. 9 is a side view of the module assembly of FIG. 8 showing the details of the logic jumpers and power jumpers for logic and power interconnection between the stacked sandwich assembly of printed circuit boards.

In the preferred embodiment of the present invention, 16 circuit boards 110 of the type shown in FIG. 7, are stacked together to form a module assembly 200 as shown in both FIG. 8 and FIG. 9. The circuit boards 110 are arranged in a 4 x 4 matrix on each of four layers, creating an X-Y-Z matrix of 4×4×4 circuit boards. Therefore, each module assembly 200 has 64 circuit boards containing 16 integrated circuit chips each, giving a total of 1,024 integrated circuit chips per module assembly.

In the preferred embodiment, the module assembly 200 is 4.76 inches wide, 4.22 inches long, and 0.244 inch thick. As is shown in FIG. 8, at one edge of the module assembly are four machined metal power blades 201a-201d. These power blades are used both for mechanical connection to the cabinet into which the module assemblies are placed and for electrical connection to the system power supplies. At the opposite side of the module assembly are 8 edge connectors 202a-202h used to communicate with other modules. These connectors form the communication paths to the other module assemblies within the machine. The bundles of wires between the circuit boards of the module assembly 200 and the board edge connectors 202a-202h are provided with strain relief members 240a-240h respectively. Each strain relief is a plastic member which protrudes from the edge of the circuit boards. The interconnected wires pass through holes in the strain relief members between the circuit boards and the floating connectors 202a-202h. In this fashion, the flexing of the wires during the connection and disconnection of connectors 202a-202h does not strain the soldered connection of the wires to the circuit boards. The strain relief members 240a-240h also serve as spacers between the circuit boards in a fashion similar to spacers 203 described below.

Electrical communication between the integrated circuit chips of each board 110 is accomplished by means of the prefabricated foil patterns on the surface and buried within each circuit board. The electrical communication between circuit boards 110 in the X-Y plane is by means of twisted wire jumpers 231 and 232 along the Z-axis (perpendicular to the planar surface of the circuit boards and the module assembly) effecting electrical connection between the circuit boards 110, two logic plates 216 and 217 sandwiched in the center of the module assembly 200 and a centrally located power distribution board 210 sandwiched between the logic plates, a shown in FIG. 9. The z-axis twisted wire jumpers 231 and 232 may be used for electrical communication signals and for power distribution. The Z-axis jumpers may be placed in any of the area on circuit boards 110 that is not occupied by an integrated circuit. In the preferred embodiment of the assembly module, anywhere from 200-1000 z-axis logic jumpers 231 may be used for a single circuit board stack. 6400-11,000 jumpers may be used for a module 200.

FIG. 9 shows a sectional view of a module assembly 200. In the preferred embodiment, module assembly 200 is constructed as a sandwich of a electronic assemblies. These assemblies include a plurality of populated circuit boards 212, 214, 219, 221, which are spaced apart from each other using insulated spacers, such as the one illustrated at 203. Another example of electronic assemblies are the logic plates 216 and 217 which are in contact with and are axially aligned with a power plate 210. All of the circuit boards are orientated so that the flying leads of the integrated circuits 104 are away from the power plate 210. Also as shown in FIG. 9, power blade 201 abuts circuit boards 212, 214, 219, 221 and logic plates 216 and 217. Additionally, power plate 210 extends into power blade 201. FIG. 9 shows all major components of a completely assembled module assembly 200 with the exception of the edge connectors which have been omitted for clarity.

All the electronic assemblies including the circuit boards and the logic plates 216 and 217 are designed so that when they are assembled into a module, their plated-through holes become substantially aligned in the Z-axis, with the complimentary plated-through holes of the other circuit boards and logic plates.

The power plate 210 is designed so that when it is assembled into a module, its larger unplated holes substantially align in the Z axis with the plated-through holes of the circuit boards and logic plates. Likewise, circuit boards 110 and power plates 210 are designed so that when assembled in a module assembly, their plated-through holes 304 become substantially aligned in the Z-axis with corresponding plated-through holes on other circuit boards and power plates.

However, logic plates 216 and 217 are designed so that when they are assembled into a module, their plated-through holes are substantially aligned in the Z axis with the plated-through holes 304 of the circuit boards and power plate.

Electrical communication between the integrated circuit chips on each board is accomplished in the X-Y plane by means of prefabricated foil patterns on the surface of, and buried within, each circuit board. Electrical communication between circuit boards 212, 214, 219, 221 is routed via foil patterns buried within logic plates 216 and 217. Electrical inter-connects between circuit boards 212, 214, 219, 221 and logic plates 216 and 217 are accomplished by inserted electrically conductive Z-axis twisted wire jumper logic jumpers 231 contacting logic plate interconnection apertures 303 on the circuit boards and logic plates.

As described in more detail below, the twisted wire, jumper logic jumpers or connectors have wire birdcage, or bulged portions that have a greater outer radius than the inner radius, or inner contact surface, of the complementary interconnection apertures shown as plated-through holes 303. When a twist-pin logic jumper 231 is inserted into the module assembly, the wire bird-cage portions compress against the plated-through holes 303 thereby forming low resistance connections.

Electrical power distribution to the integrated circuit chips on each board 110 is accomplished by means of prefabricated foil patterns on the surface of, and buried within, each circuit board 110. Electrical power is distributed to circuit boards 212, 214, 219, 221 through power plate 210 which connects to each of the power blades 201a-201d. Electrical power inter-connections between circuit boards 212, 214, 219, 221 and power plate 210 are accomplished by inserted Z-axis twisted wire jumper power jumpers or connectors 232. As described in more detail below, the twisted wire jumper power jumpers also have bulged portions, or wire birdcages that, when uncompressed, have a greater outer radius than the inner radius, or inner contact surface, of the interconnection apertures represented by plated-through holes 304. When a twist-pin power jumper 232 is inserted in the module assembly, the wire bird-cages compress against the plated-through holes 304 thereby forming low impedance connections.

In the preferred embodiment, module assembly 200 is stacked with other module assemblies in a fluid cooling tank and positioned so that the planar surfaces of the module assembly are stacked vertically. Thus, in the preferred embodiment, FIG. 9 is a top-down look at module assembly 200. A type of cooling apparatus suitable for cooling the circuit board module assemblies of the present invention is described in U.S. Pat. No. 4,590,538 incorporated herein by reference.

Cooling channels 230, as shown in FIG. 9, are provided to allow the cooling fluid to rise through the module assembly to remove the heat produced by the integrated circuits 104. Heat transfer occurs between circuit boards 1 through 4 (levels 212, 214, 219, and 221 respectively) and the cooling fluid in channels 230. Cooling channels 230 are created by spacing the circuit boards populated with integrated circuits 104 from one another and from the logic plates using the above mentioned insulated spacers 203. The insulated spacers 203 are held in place by twisted wire jumper power jumpers 232 during module assembly.

Twist-Pin Connectors

Figure 10A:
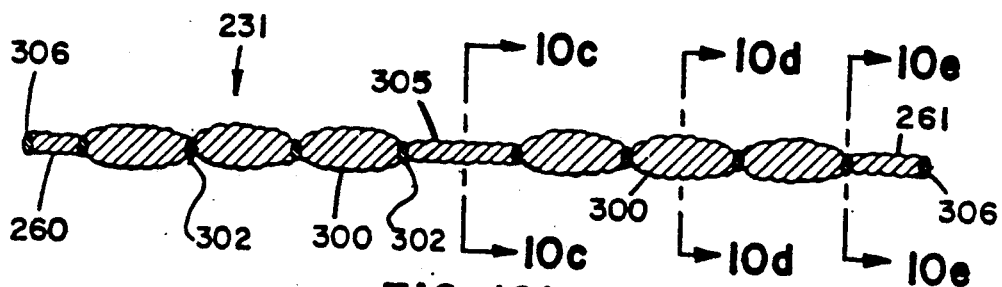
FIG. 10a shows the twisted wire jumper logic jumper or connector.

FIG. 10A shows a single logic twisted wire jumper connector for coupling logic level signals between the various electronic assemblies. The preferred embodiment of the twisted wire jumper shown in FIG. 10a includes a leader section 260, and a tail section 261. Six bird cages 300 are formed between the crimps shown on logic jumper 231. It is preferred to weld the ends of the twisted wire jumper to form blunt nose sections as shown by weld 306. The leader 260 and the tail 261 extend approximately 0.004 inches beyond the module assembly after insertion and may be used to assist in both installation of the twisted wire jumper connector, and its removal for module disassembly. At each end of the connector a laser weld 306 is used to keep the wires making up the twisted wire jumper connector 231 from unraveling. The crimps 302 are used to form the wire bird cages 300. The crimps 302 and cages 300 spaced along the twisted wire jumper to match the interboard spacing. It has proved desirable to extend the cages beyond the edges of the plated-through apertures in the printed circuit boards. For the Cray-3 product this has resulted in .028 inch crimp spacing. The six bird cages 300 are made as described below.

In the preferred embodiment the logic twisted wire jumper 231 is made from seven strand multifilament Be/Cu wire tempered to either ¼ or ½ hard. It is preferred to use wire with uniform strand diameters of approximately 1.5 to 1.6 mils in diameter. It is also preferred to use a nickel flashed, 30 microinch gold plated, beryllium copper alloy 25 CDA wire available from California Fine Wire Co. and other vendors. The seven strands are configured as a six around one helix. The wire diameter is approximately 4.8 mils before the bird cages 300 are formed. The bird cages 300 bulge outward to an outer radius of approximately 8.0 mils.

Figure 10B:
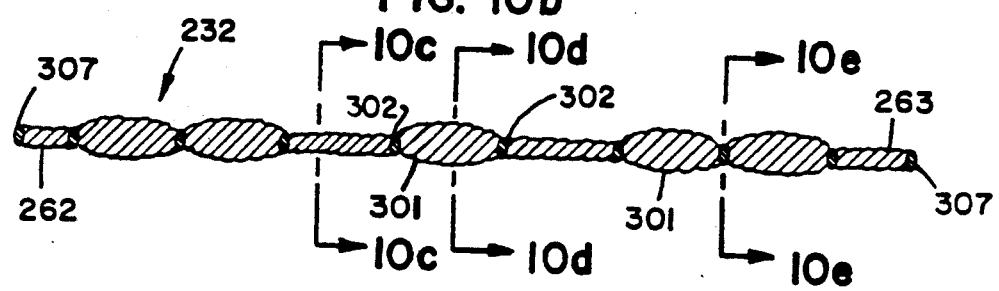
FIG. 10b shows the twisted wire jumper power jumper or connector.

FIG. 10B shows a single power twisted wire jumper connector for coupling power to the various electronic assemblies. In the preferred embodiment the power twist-pin jumper has a leader section 262, a tail section 263, and a number of crimps 302 forming five wire bird cages 301. The leader 262 and tail 263 extend approximately 0.004 inches beyond the module assembly after insertion and are used to assist in installation and removal of the twisted wire jumper connector. At each end of the connector there is a weld 307 to keep the wires making up the twisted wire jumper connector from unraveling.

The 5 bird cages 301 are spaced so that each bird cage substantially aligns with a corresponding power plated-through hole 304 of the module assembly 200. The five wire bird-cages 301 are spaced so that each bird-cage substantially aligns with a corresponding power plated-through hole 304 of the module assembly 200.

In the preferred embodiment the power twisted wire jumper 232 is made from seven strands of either ¼ or ½ hard, 0.0048 mil diameter, nickel flashed, 30 microinch gold plated, beryllium copper alloy 25 CDA wire. The multifilament wire is wound six around one (FIG. 10C) in a left handed helix. At present the preferred wrap is 30 turns per inch. The wire diameter is approximately 14.4 mils before the bird cages are formed. The bird cages bulge outward to an outer radius of approximately 16.0 mils.

FIG. 11 shows a cut-away view of a single logic twisted wire jumper installed in a module assembly. The bird cages 300 compress against the plated-through holes 303 forming low impedance electrical connections. The leader 260 and tail 261 extend beyond the module assembly to assist in module disassembly. Also shown are conductive paths 400 connected to circuit boards 212, 214, 219, and 221 for logic level routings to integrated circuits 104.

Figure 12:
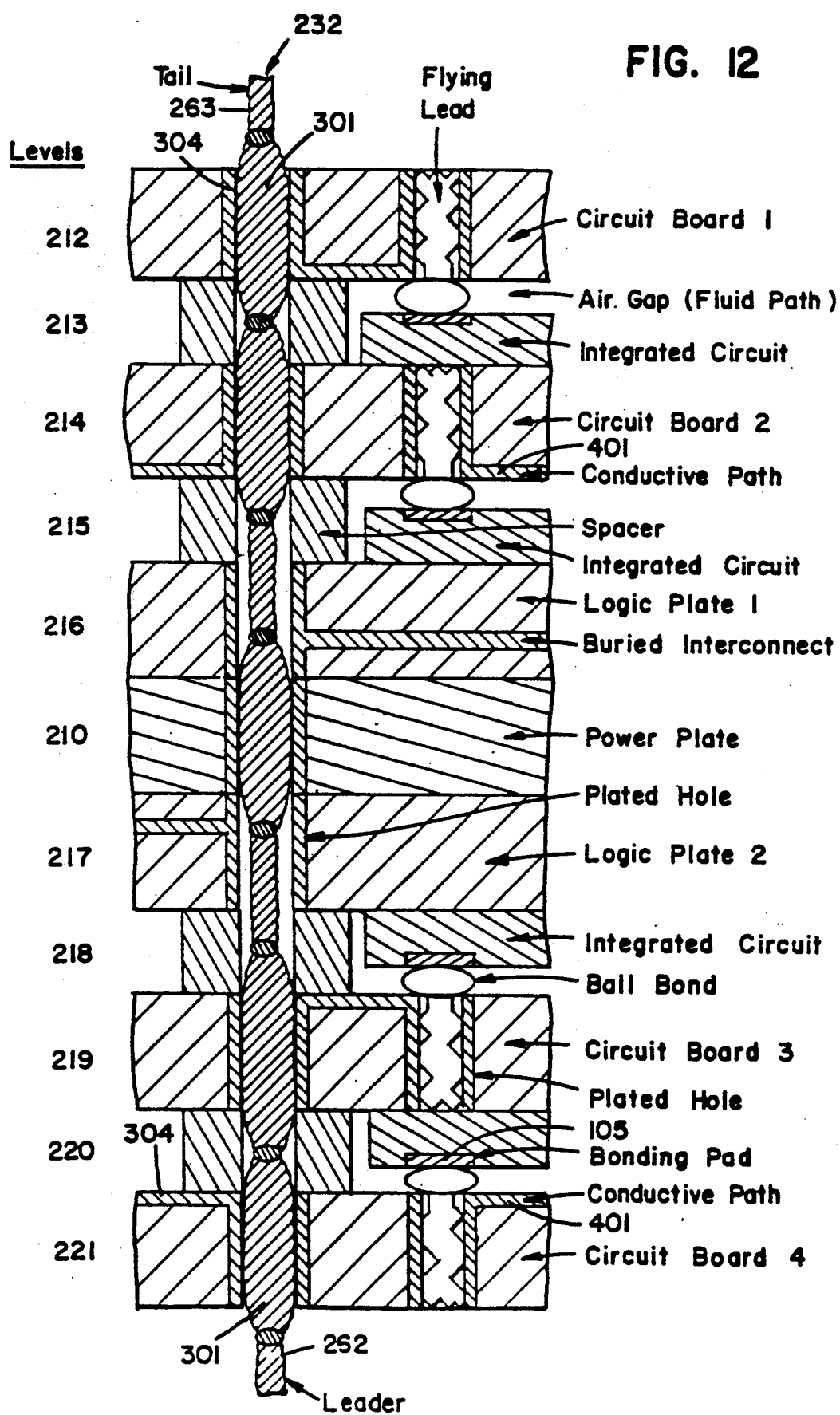
FIG. 12 is a cross-sectional view of a single twisted wire jumper power jumper that has been installed through the axially aligned plated-through holes of the stacked array of printed circuit boards of the module assembly of FIG. 9. The figure is shown in an exaggerated scale to clarify the operation of the invention.

FIG. 12 shows a cut-away view of a single power twisted wire jumper installed in a module assembly. The bird cages, one of which is shown at 301, compress against the plated-through holes, one of which is shown at 304, forming low impedance electrical connections. The leader 262 and tail 263 extend beyond the module assembly to assist in module disassembly. Also shown are conductive paths 401 connected to circuit boards 212, 214, 219, and 221 for power routings to integrated circuits 104.

Figure 13:
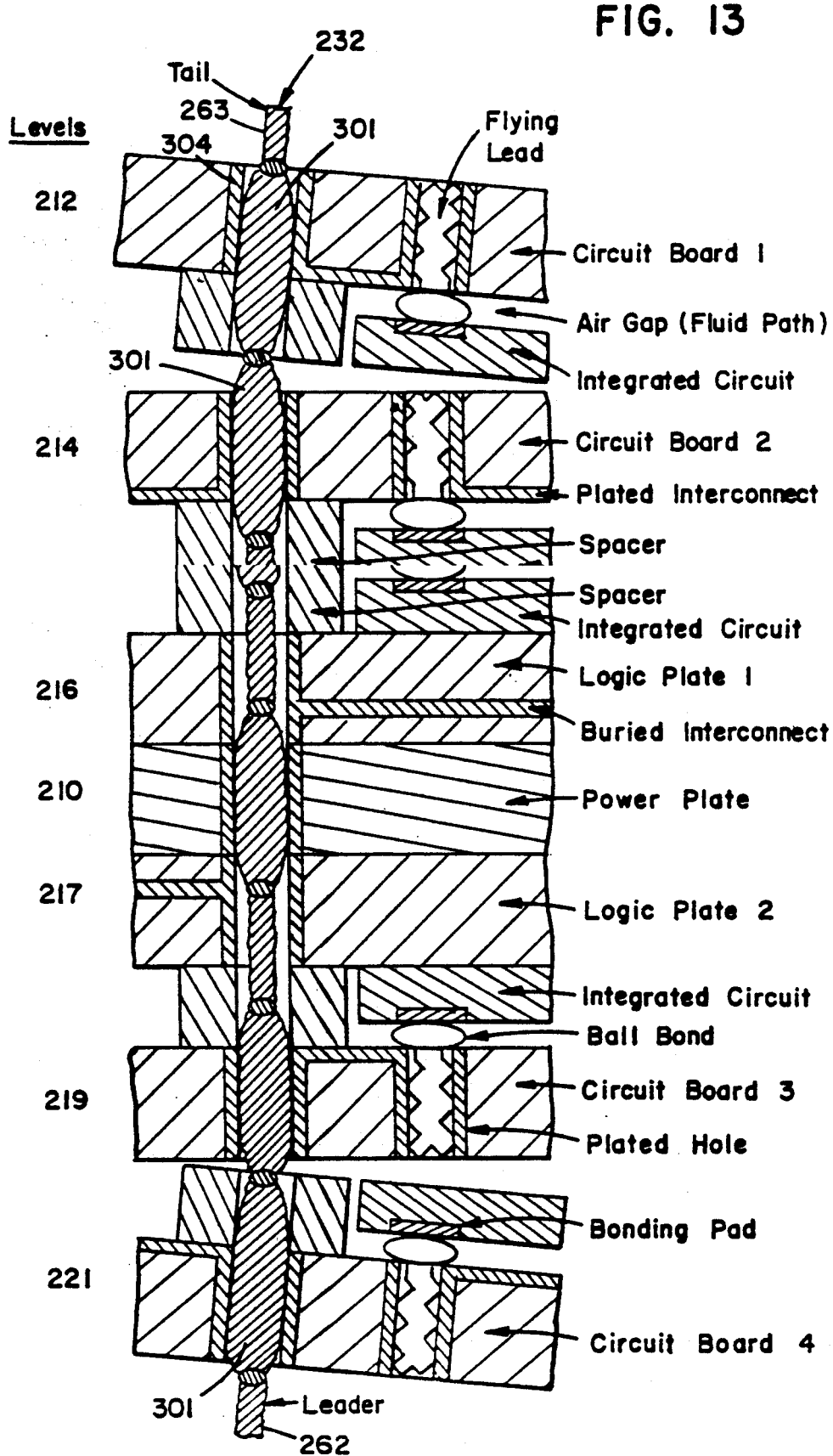
FIG. 13 is a side view mechanical schematic which has been greatly exaggerated to show a single twisted wire jumper compensating for the misalignment of a stack of printed circuit boards.

Both jumpers 231 and 232 are flexible and therefore can compensate for minor misalignment of a module assembly. FIG. 13 shows a single power twisted wire jumper installed in a mis-aligned module assembly which is depicted in greatly exaggerated form to clearly disclose this feature of the invention. The twisted wire jumper flexes so that the bird-cages 301 compress against the plated-through holes 304 of the circuit boards 212, 214, 219, and 221 and power plate 210. The logic twist-pin jumper will similarly flex to compensate for module misalignment along any axis.

Figure 14:
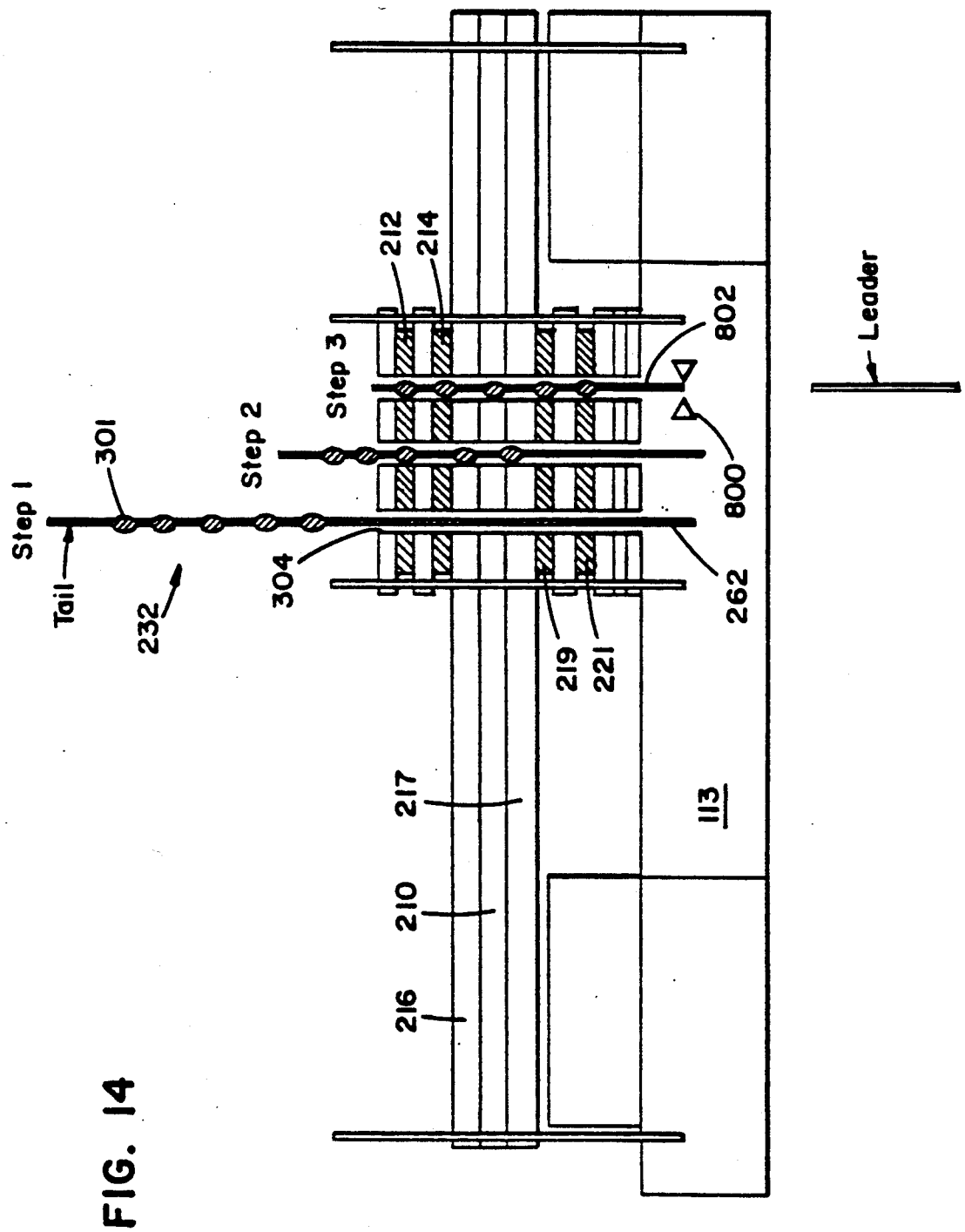
FIG. 14 shows a method for installing twisted wire jumper connectors into stack assembly of four printed circuit boards.

FIG. 14 shows a method of inserting the twisted wire jumper connectors. A number of the electronic assemblies are stacked and aligned through the use of guide pins. The leader 262 of twisted wire jumper 232 is inserted into the interconnection apertures 304 and passed completely through the stacked array. The leader is then grasped and drawn through the stacked electronic assemblies until it is substantially completely through the assemblies. At this point each of the cages is drawn into engagement with the periphery of the various plated-through apertures. The leader is then cut off by a suitable cutter 800. A short stub 802 is left as an aid to the subsequent removal of the twisted wire jumper.

Figure 10C:
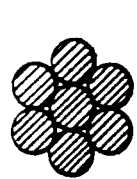
FIG. 10c depicts a cross section of the wire.
Figure 10D:
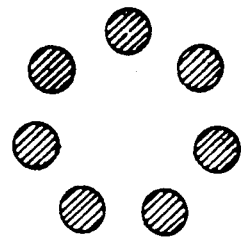
FIG. 10d depicts a cross section of the bird cage.
Figure 10E:
FIG. 10e shows a cross section of a crimp in the wire.

FIG. 15 shows a method of manufacturing the twisted wire jumpers in a preferred embodiment. In step 1, the wire is clamped between two feeder clamps 804 and 806. This operation places the wire under slight tension. Next a laser or other cut off device 808 is used to cut the wire by melting the wire. This operation forms a rounded or blunt point 810 on the wire which is an aid in threading the wire through the apertures. Next the wire is advanced to form the leader portion of the twisted wire jumper. The formation of the bird cage structure 812 begins with the crimping operation shown in step 2. The purpose of the crimping operation is to join or fuse the strands of the mulitifilament sheath together. This operation also results in the coupling of the outer sheath to the inner core wire as well. If the collar formed by the crimping operation rigidly joins the sheath to the core, the untwisting operation results in a bird cage which has seven strands in the barrel shaped cage. This converts the wire from a six around one configuration to a seven around zero configuration. The six around one configuration is shown in FIG. 10c which illustrates a cross section of the cylindrical section of the wire. The antihelical twisting operation displaces the core from its center position to force it into the cage structure. This is illustrated in the drawing by FIG. 10d where the outer periphery of the cage is composed of seven strands. The crimp 302 portion of the wire can be seen in FIG. 10e.

Typically two crimped collars are formed at a time. One of the crimping chucks is stationary and the other is rotatable. In step 3 the rotatable chuck is used to unwind the helical sheath by rotating the collar in the antihelical direction. At present the preferred degree of rotation is 160° while rotations in the range of 100° to 180° appear to be acceptable. This counter rotation increases the effective diameter of the twist wire connector and forms a resilient bird cage structure 812 for frictional engagement with apertures of the electronic assemblies, thus forming a connector portion. Once a cage is formed the wire is advanced to form a cylindrical section of the twisted wire jumper. In step 4 the wire is advanced to the next station and the crimping operation is resumed to form the next cage.

Figure 16A:
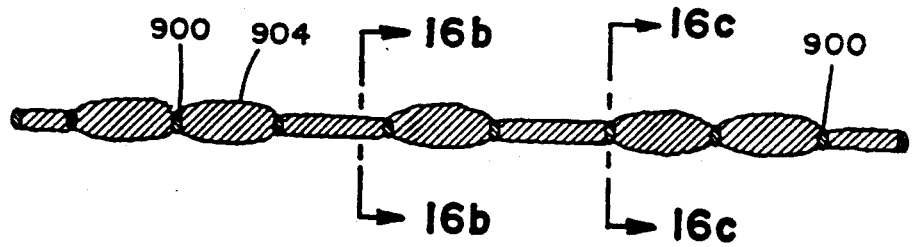
FIG. 16a shows an alternate form of a twisted wire jumper.
Figure 16B:
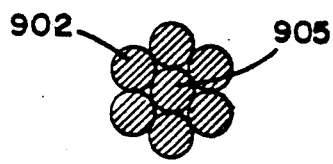
Figure 16C:
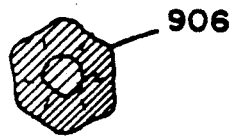

It is also contemplated to form the bird cages with the center core strand relatively free to absorb tension forces resulting from the insertion of the twist wire jumpers. This structural relationship is achieved through the use of a laser weld which joins the outer sheath strands 902 to each other as shown at 906 but not to the center core strand 905 (FIGS. 16b and 16c). This form of construction gives the twist wire jumper the appearance shown in FIG. 16c. In FIG. 16a laser welds 900 are formed on the wire through an operation performed by a laser such as that depicted as 808 in FIG. 15. These laser welds are used to separate the bird cages 404 from each other. In this embodiment the welds have a length of 3 to 6 mils while the bird cages themselves are about 28 mils long. It should be appreciated that the crimping fixtures show in the FIG. 15 can also be adapted to fuse the helical sheath strands to each other as well.

Those of ordinary skill in the art will recognize that other types of wire may be used in place of the wire described herein. For example, multistranded wires which are made with differing strand alloys may be substituted.

While the present invention has described connection with the preferred embodiment thereof, it will be understood that many modifications will be readily apparent to those of ordinary skill in the art, and this application is intended to cover any adaption or variations thereof. Therefore, it is manifestly intended that this invention be limited only by the claims and the equivalents thereof.

We claim:

1. Interconnection apparatus comprising:
   a plurality of electronic assemblies positioned in a stack, each electronic assembly having an interconnection aperture, each interconnection aperture having an inner contact surface at the periphery of the aperture, the interconnection apertures of each electronic assembly aligning with the interconnection apertures of all the other electronic assemblies positioned in the stack; and
   an elongated twisted wire jumper extending within the aligned interconnection apertures of the stacked electronic assemblies, the jumper having a plurality of cage members positioned therealong, each cage member resiliently and conductively engaging the inner contact surface to electrically interconnect and mechanically couple the electronic assemblies together in the stack.

2. The apparatus of claim 1 wherein said plurality of electronic assemblies further comprises:
   at least one power distribution plate.

3. The apparatus of claim 1 wherein said plurality of electronic assemblies further comprises:
   at least one circuit board carrying at least one active integrated circuits.

4. The apparatus of claim 1 wherein said plurality of electronic assemblies further comprises:
   at least one logic interconnection plate.

5. The apparatus of claim 1 further comprising:
   three or more electronic assemblies positioned in a stack, each assembly having a plurality of interconnection apertures, the electronic assemblies positioned in the stack with groups of interconnection apertures in alignment in the stack, each interconnection aperture having an inner contact surface at the periphery of each said interconnection aperture;
   a plurality of twisted wire jumpers, each jumper extending through one group of aligned interconnection holes in the stacked assemblies, each jumper having a plurality of cage members positioned along the length of the jumper for compressive engagement with the contact surfaces of the interconnection apertures of each group to electrically interconnect and mechanically couple the stacked assemblies together.

6. The apparatus of claim 1 or 5 wherein said twisted wire jumper further comprises:
   a central core strand;
   a plurality of coil strand wound in a sheath surrounding said central core stand; and
   wherein each cage member comprises a plurality of resilient coil strands from the sheath formed generally into a barrel shape spaced from the core strand.

7. The apparatus of claim 6 wherein said coil strands and said core strand have the same strand diameter.

8. The apparatus of claim 6 wherein said coil strand diameter exceeds the core strand diameter.

9. The apparatus of claim 6 wherein said coil strand diameter is less than the core strand diameter.

10. The apparatus of claim 6 wherein said sheath comprises six coil strands helically wound around a single core strand.

11. The apparatus of claim 1 or 5 wherein said twisted wire jumper further comprises:
    a central core strand;
    a plurality of coil strands surrounding said core strand and forming said cage members in a bulged shape for resilient frictional engagement with and compression against the inner contact surfaces of said interconnection apertures, the cage members providing electrical interconnection and releasable mechanical connection between said assemblies.

12. The apparatus of claim 1 or 5 wherein said twisted jumper further comprises:
    a central core strand having a head portion and having a tail portion;
    a plurality of coil strands wound surrounding the core strand, the coil strands wound to form a sequence of the bulged cage members at predetermined locations for contacting the inner contact surfaces to electrically connect and mechanically releasably connect the assemblies, the coil strands also wound to form a sequence of sections between the cage members for electrically coupling of the cage members and for the mechanical support of the cage members.

13. The apparatus of claim 12 wherein the bulged cage members are separated from said sections by crimping the coil strands to the central core strand.

14. The apparatus of claim 12 wherein the bulged cage members are separated from said sections by laser welding the coil strands to the central core strands.

15. The apparatus of claim 12 wherein the twisted wire jumper further includes a head section having a blunt nose.

16. The apparatus of claim 12 wherein the twisted wire jumper further includes a tail section having a blunt nose.

17. The apparatus of claim 1 or 5 wherein said twisted wire jumper further comprises:
    a plurality of cylindrical portions, each cylindrical portion separating and connecting a pair of cage members, each cylindrical portion comprising a center core strand and a plurality of helically wound coil strands formed in a sheath surrounding said central core strand; and wherein:
    each of the plurality of cage members comprise a plurality of coil strands of a resilient characteristic formed by untwisting selected stands of the sheath.

18. A method of electrically interconnecting a plurality of electronic assemblies, each assembly having an interconnection aperture with an inner contact surface at the periphery of the interconnection aperture, comprising the steps of:

stacking said assemblies to align said interconnection apertures of all the assemblies in the stack;

inserting a twisted wire jumper in the aligned interconnection apertures, the jumper having a plurality of resilient bulged cage members for frictional engagement with the inner contact surface of said interconnection apertures; and drawing said twisted wire jumper within said aligned interconnection apertures to position the bulged cage members in resilient frictional mechanical and electrical engagement with the inner contact surface of said interconnection apertures.

19. The method of claim 18 further comprising forming said twisted wire jumper by steps comprising:

clamped a multiple strand helically wound wire to place it under tension;

melting said wire to form a blunt nose;

crimping said wire at first and second locations to form a pair of crimp collars;

rotating said wire at the first and second locations in an antihelical direction to form the bulged cage members between the crimp collars.

* * * * *